(12) United States Patent
Jang et al.

(10) Patent No.: US 12,334,694 B2
(45) Date of Patent: *Jun. 17, 2025

(54) ELECTRIC APPLIANCE AND ADAPTER

(71) Applicant: SOLUM CO., LTD., Gyeonggi-do (KR)

(72) Inventors: Young Jun Jang, Gyeonggi-do (KR); Hyun Su Kim, Gyeonggi-do (KR); Jun Kyu Lee, Gyeonggi-do (KR); Pill Ju Kim, Gyeonggi-do (KR); Sang Keun Ji, Gyeonggi-do (KR); Dong Kyun Ryu, Seoul (KR)

(73) Assignee: SOLUM CO., LTD., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/596,648

(22) Filed: Mar. 6, 2024

(65) Prior Publication Data

US 2024/0213730 A1 Jun. 27, 2024

Related U.S. Application Data

(63) Continuation of application No. 17/529,883, filed on Nov. 18, 2021, now Pat. No. 11,955,755.

(30) Foreign Application Priority Data

Dec. 2, 2020 (KR) .......................... 10-2020-0166351

(51) Int. Cl.
*H01R 13/533* (2006.01)
*H01R 31/06* (2006.01)
*H02J 7/00* (2006.01)

(52) U.S. Cl.
CPC ......... *H01R 31/065* (2013.01); *H01R 13/533* (2013.01); *H02J 7/0045* (2013.01)

(58) Field of Classification Search
CPC .......................... H01R 13/533; H01R 13/6675; H01R 31/065; H01R 31/06; H01R 4/4818;

(Continued)

(56) References Cited

U.S. PATENT DOCUMENTS 7,978,489 B1 7/2011 Telefus et al.
2011/0226526 A1* 9/2011 Chu ....................... H02G 3/088
174/659

(Continued)

FOREIGN PATENT DOCUMENTS

DE 2634919 A1 * 6/1968 ........... G01F 23/706
DE 26 34 919 6/1988

(Continued)

OTHER PUBLICATIONS

Extended European Search Report dated Apr. 19, 2022 for European Patent Application No. 21211900.2.

(Continued)

*Primary Examiner* — Timothy J Thompson
*Assistant Examiner* — Guillermo J Egoavil
(74) *Attorney, Agent, or Firm* — WOMBLE BOND DICKINSON (US) LLP

(57) ABSTRACT

Provided are an electric appliance and a method of manufacturing the same, the electric appliance having a smaller size and a reduced overall weight by preventing a fluid from flowing into a space unrelated to a heating component in a state where the fluid fills its case. The electric appliance includes: a case including a first space and a second space communicated to each other; a first component disposed in the first space; a second component disposed in the second space; a connection portion electrically connecting the first component and the second component to each other; and a potting pattern including a resin material and formed in the first space.

16 Claims, 9 Drawing Sheets

(58) Field of Classification Search
CPC ......... H01R 9/24; H01R 12/57; H02J 7/0045; H02J 7/00; H05K 7/20463; H05K 361/699
USPC ......................................................... 361/699
See application file for complete search history.

(56) References Cited

U.S. PATENT DOCUMENTS

| | | | |
|---|---|---|---|
| 2013/0016476 A1 | 1/2013 | Sharifipour et al. | |
| 2015/0013956 A1* | 1/2015 | Yoshizumi | H05K 7/20463 165/185 |
| 2019/0110368 A1 | 4/2019 | Liskow | |
| 2022/0173561 A1 | 6/2022 | Jang et al. | |

FOREIGN PATENT DOCUMENTS

| | | | | |
|---|---|---|---|---|
| DE | 102018106003 A1 * | 9/2019 | ............... | H01R 9/24 |
| DE | 10 2018 106 003 | 12/2019 | | |
| EP | 1 076 479 | 2/2001 | | |
| EP | 1076479 A1 * | 2/2001 | ............. | H05K 1/189 |
| JP | 9-55585 | 2/1997 | | |
| JP | 2000-209474 | 7/2000 | | |
| JP | 2003-249780 | 9/2003 | | |
| JP | 2004-265748 | 9/2004 | | |
| JP | 2005-340698 | 12/2005 | | |
| KR | 10-0677620 | 2/2007 | | |
| WO | 2021/034099 | 2/2021 | | |
| WO | WO-2021034099 A1 * | 2/2021 | ............. | C08G 18/02 |

OTHER PUBLICATIONS

Notice of Allowance dated Dec. 6, 2023 for U.S. Appl. No. 17/529,883 (published as US 2022/0173561).

Office Action dated Aug. 11, 2023 for U.S. Appl. No. 17/529,883 (published as US 2022/0173561).

* cited by examiner

[FIG. 1]
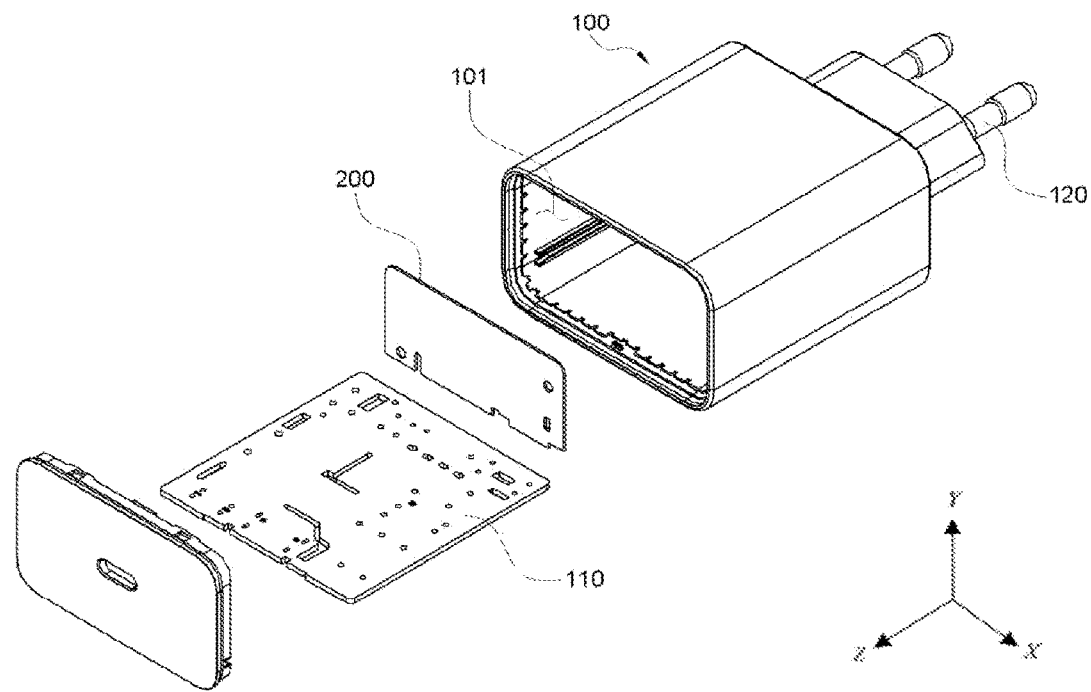

[FIG. 2]
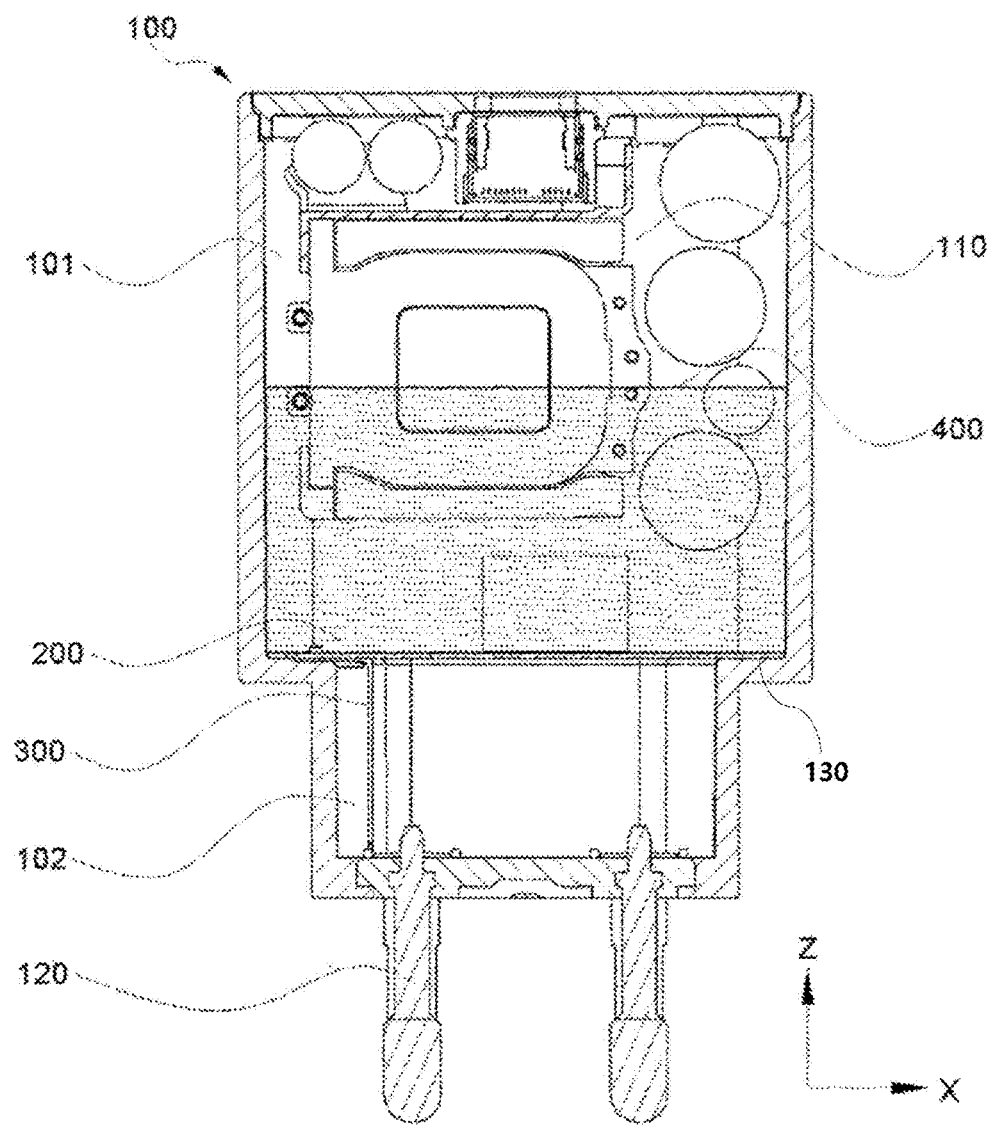

[FIG. 3]
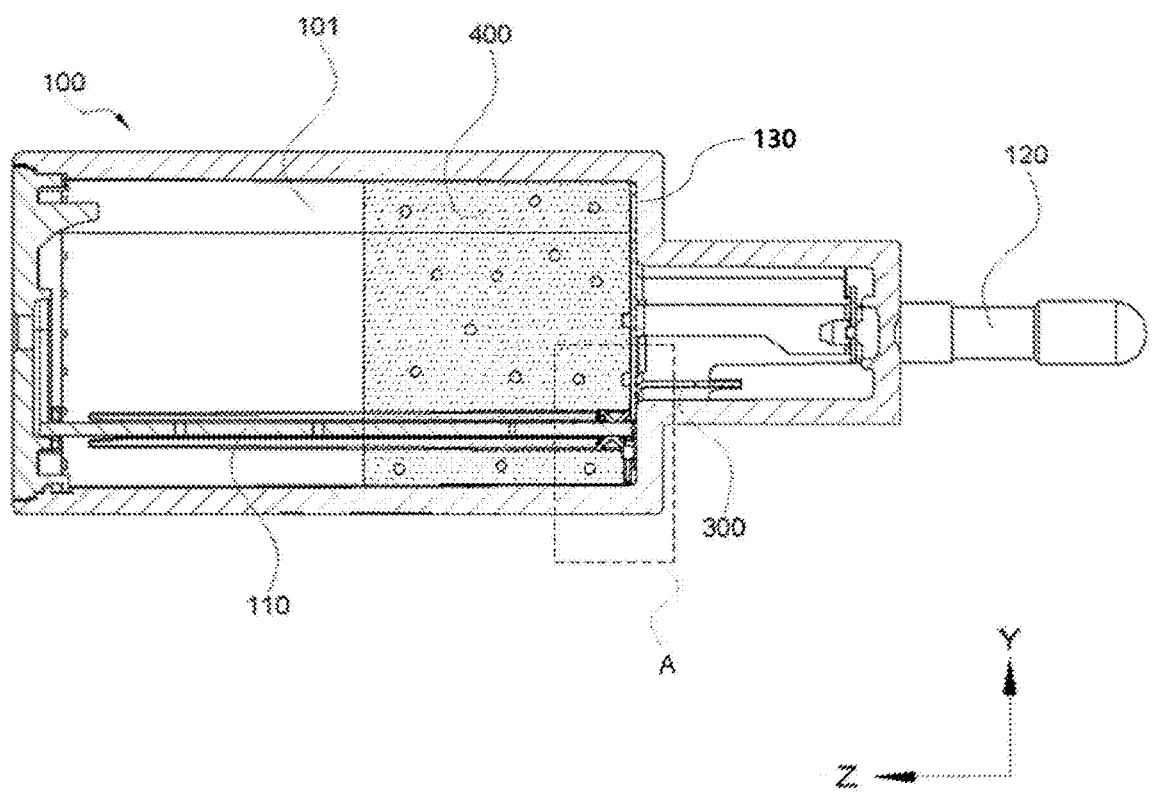

[FIG. 4A]
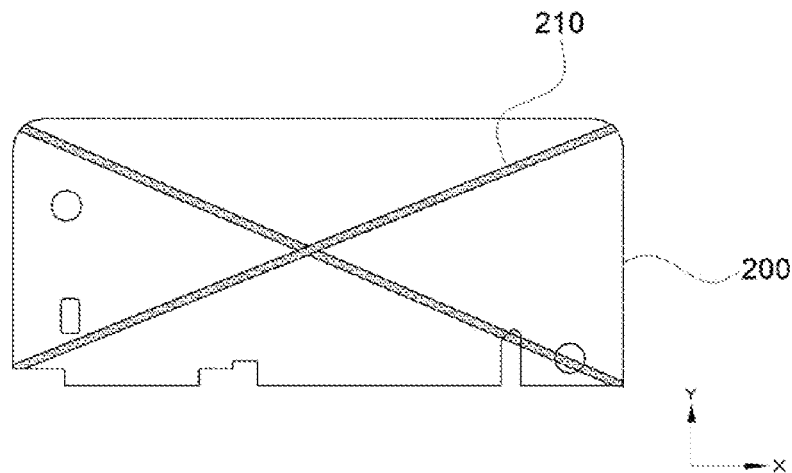
[FIG. 4B]
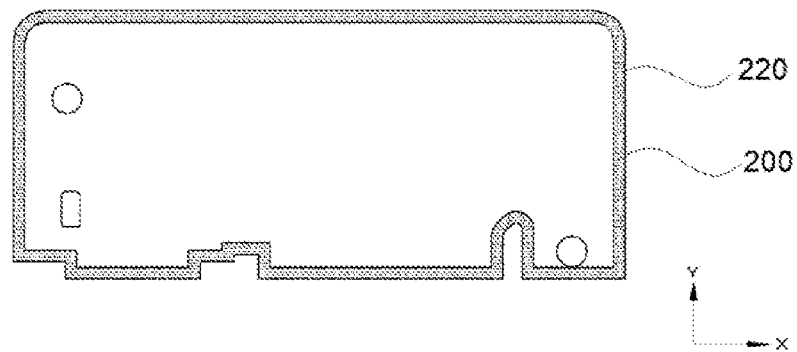
[FIG. 4C]
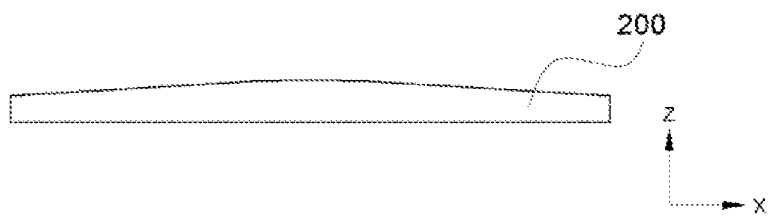
[FIG. 4D]
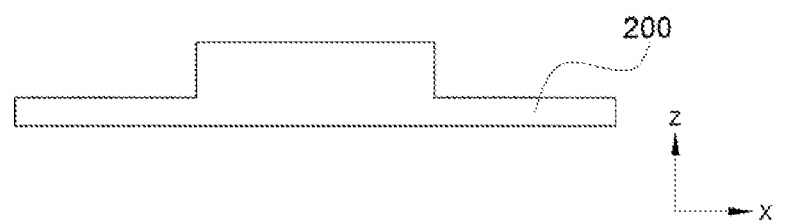

[FIG. 5A]
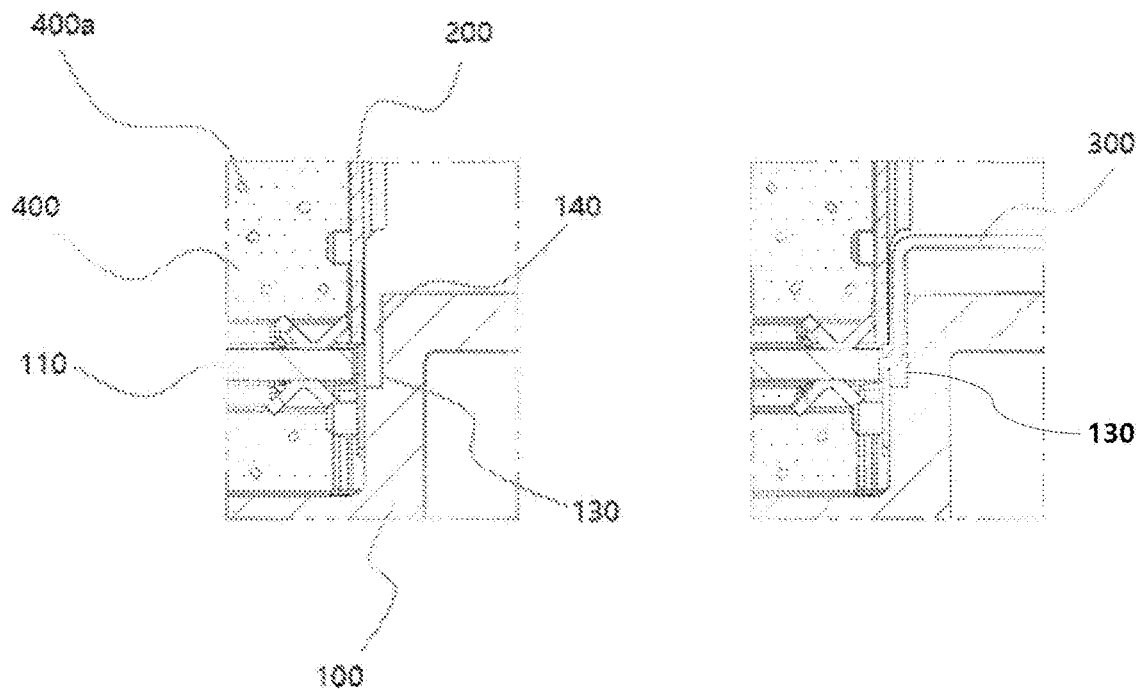
[FIG. 5B]
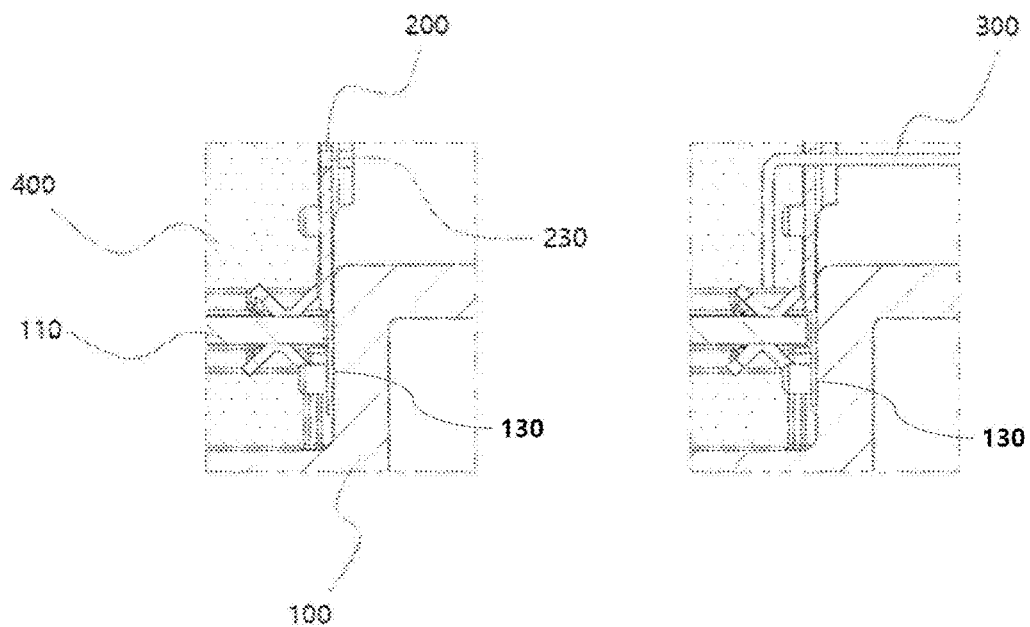

[FIG. 5C]
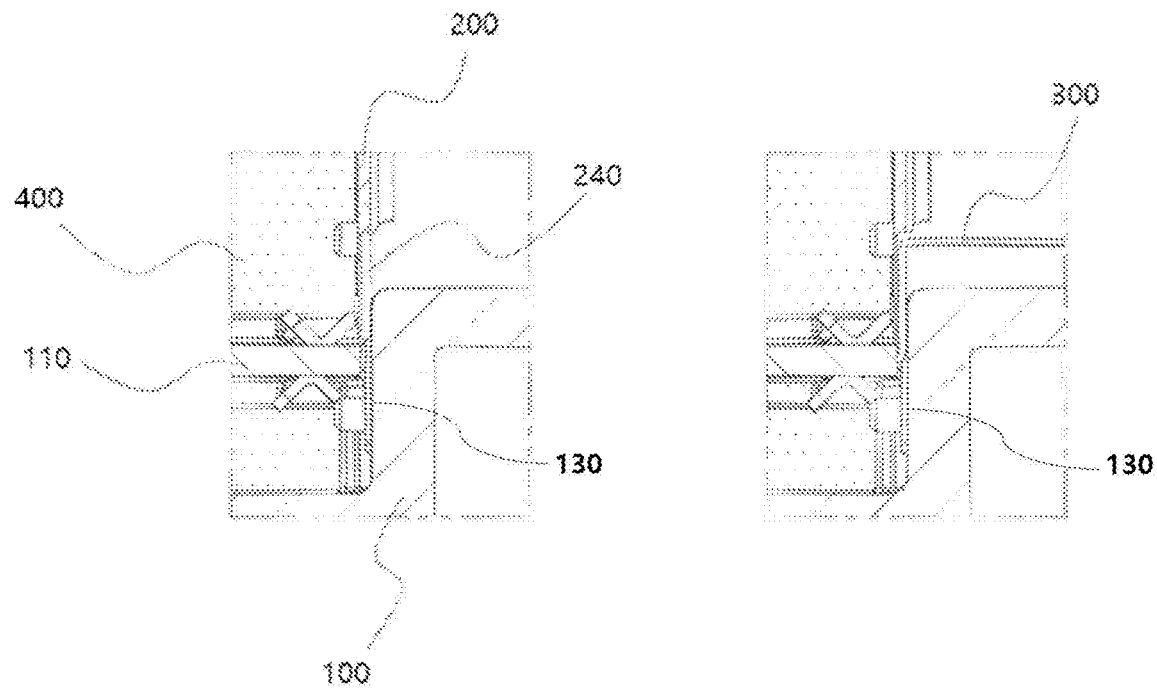
[FIG. 5D]
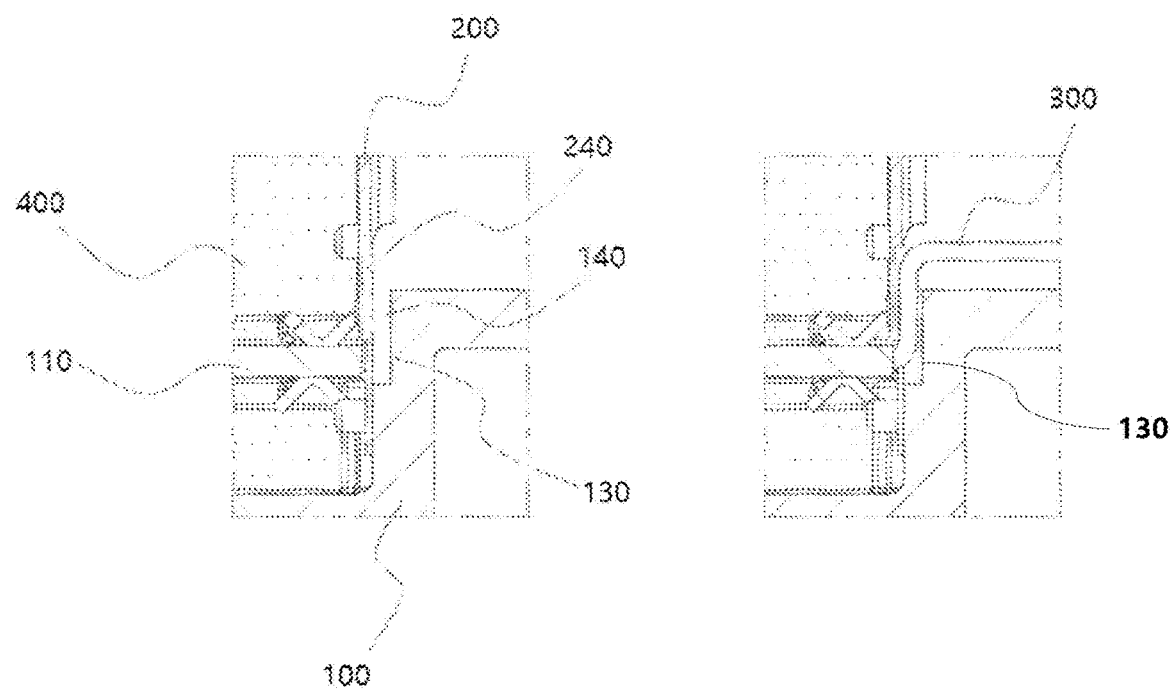

[FIG. 6]
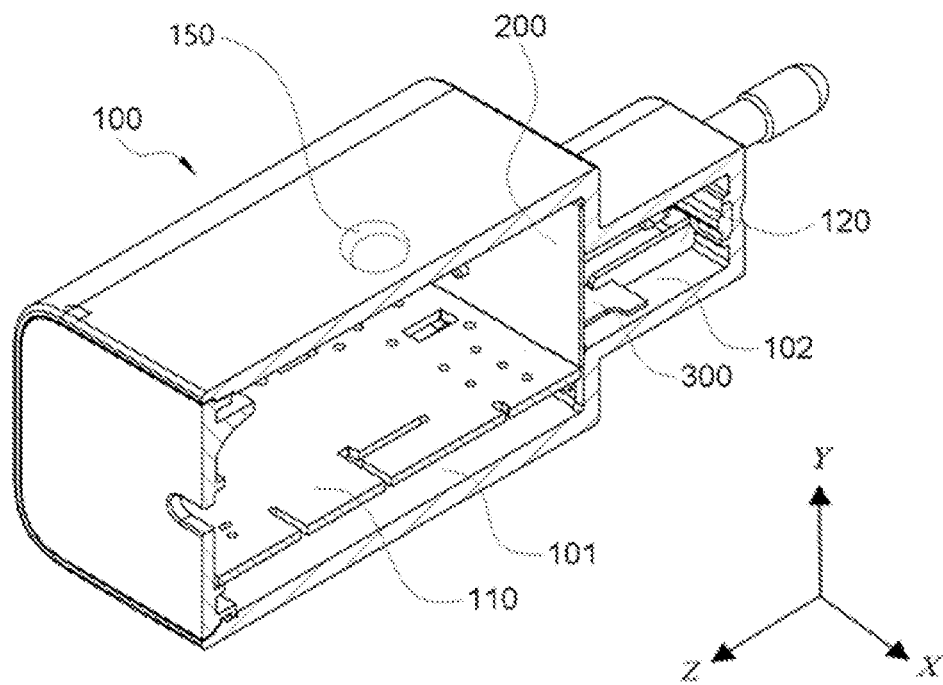

[FIG. 7]
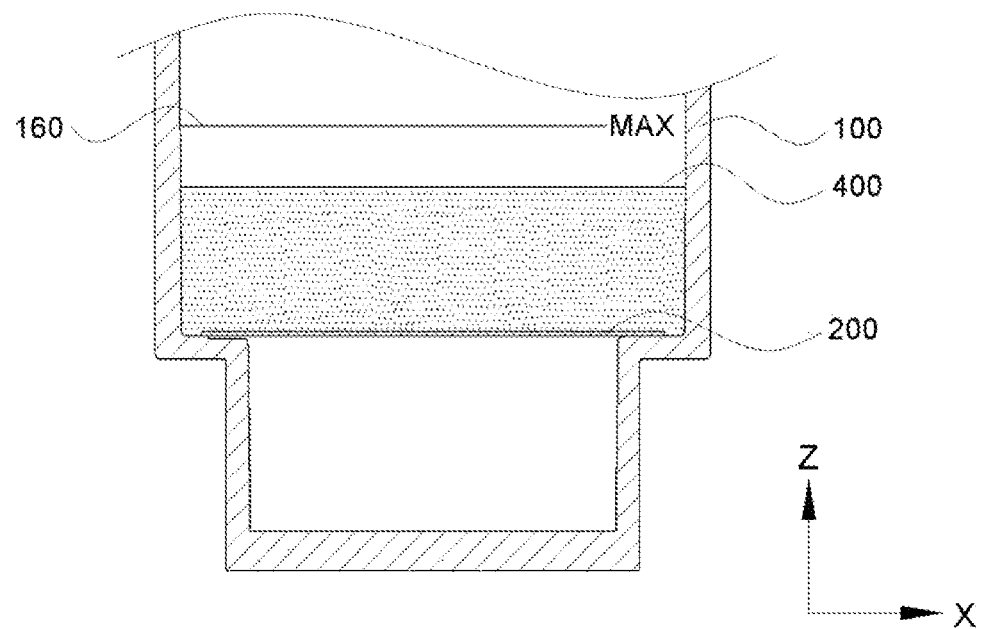

[FIG. 8]
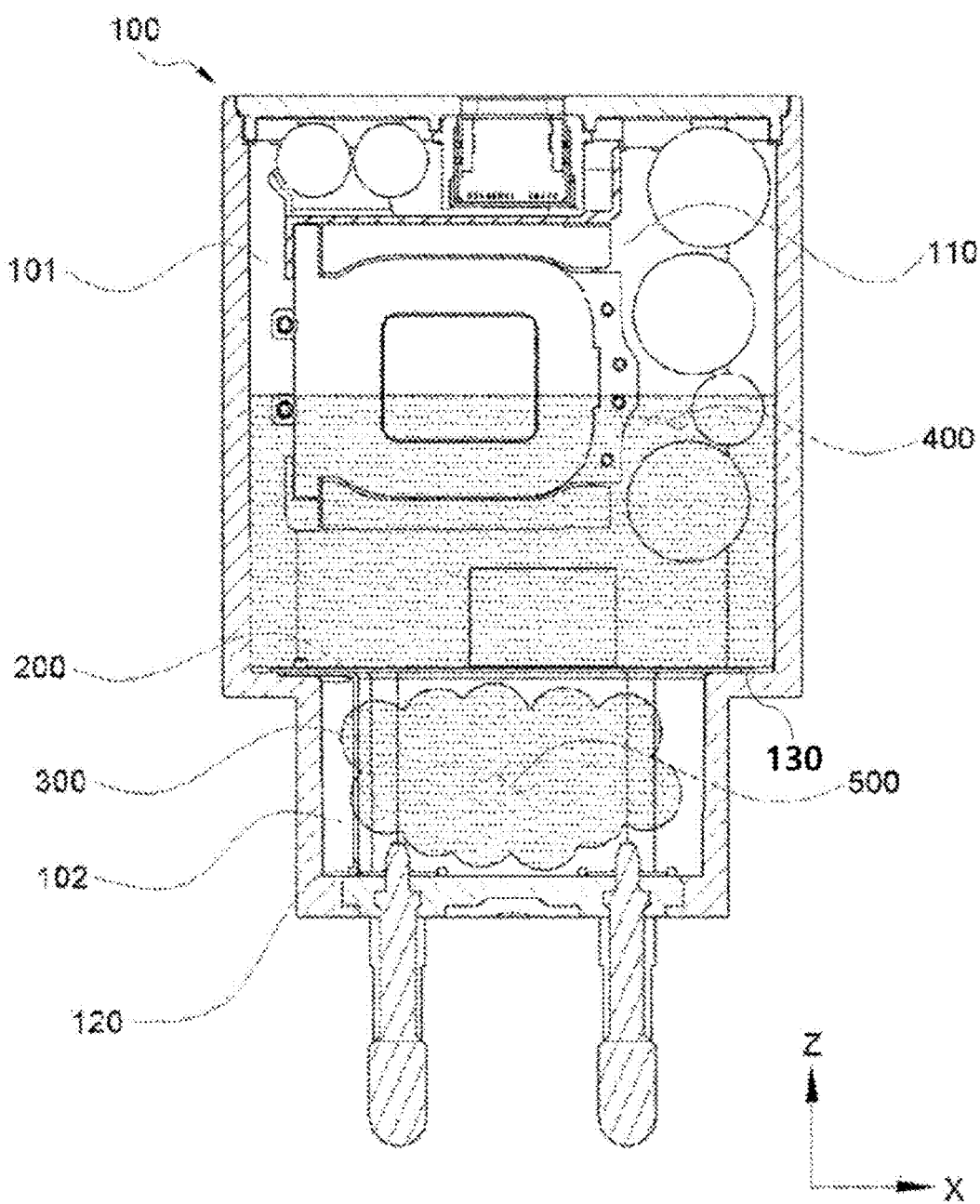

ELECTRIC APPLIANCE AND ADAPTER

CROSS-REFERENCE TO RELATED APPLICATIONS

This application is a continuation of U.S. patent application Ser. No. 17/529,883 filed on Nov. 18, 2021, claims priority under 35 U.S.C. § 119 to Korean Patent Application No. 10-2020-0166351, filed on Dec. 2, 2020, in the Korean Intellectual Property Office, the disclosure of which is incorporated herein by reference in its entirety.

TECHNICAL FIELD

The following disclosure relates to an electric appliance, and more particularly, to an electric appliance or an adapter including a partition wall preventing a fluid, provided for the heat radiation and heat dissipation of a component installed in its case, from being deviated from a predetermined region.

BACKGROUND

It is a trend that an electric appliance has a smaller size, lighter weight and larger capacity day by day. In particular, there is a high demand for a charger charging a mobile device to have a smaller size, lighter weight and larger capacity. Hereinafter, the electric appliance is described based on the charger which is its representative example. However, a scope of the present disclosure is not limited to the charger.

In recent years, the mobile device has larger capacity and consumes more power, and a battery which is a power source of the mobile device is thus required to have increased capacity and shorter charging time. When an output capacity of the charger is increased to satisfy this demand, its maximum heating temperature may be increased. In general, the electric appliance may use a case as a heat sink to dissipate its internal heat to the outside, thereby lowering a temperature of its internal component. However, for the electric appliance in which a user may touch its case such as the charger, the case that the user may touch is required to maintain its surface temperature lower to a predetermined level (e.g., 50 degrees) or less to prevent a low-temperature burn of the user. There may thus be a restriction on using the case as the heat sink.

A conventional charger may have a size large enough to dissipate the heat by using a natural convection phenomenon in the charger. However, in this conventional charger, an internal component of the charger may be continuously exposed to an excessively-high temperature, and the component continuously exposed to the excessively-high temperature for a long time may have a short lifespan, malfunction or damage. Moreover, when the charger has a larger capacity and a smaller size, it may cause an increased amount of the heat generated in the internal component, a reduced distance between the internal components, and a narrower space between the internal component and the case. Here, a problem of the excessively-high temperature in the charger may become more serious, and it may thus be difficult to allow the charger to achieve the larger capacity and the smaller size.

In addition, when the smaller-sized charger has the case filled with a fluid having high thermal conductivity to dissipate the heat, it may be difficult to insert a fluid injection nozzle into the case due to the narrower separation space among the component, a substrate and the case. In this case, it may be difficult to evenly inject the fluid, and an air pocket may easily occur in a space among the component, the substrate and the fluid, thus reducing heat radiation performance.

In addition, in order to solve the above problem, the fluid having high thermal conductivity may first be injected into the case in which the component and the substrate are yet to be assembled to each other, and the component and substrate may then be inserted into the case to be assembled to each other. In this case, a portion in which an electrical terminal, the component and the substrate, disposed in the case, are in contact with one another may be immersed in the fluid. Alternately, the component and the substrate may be assembled to each other in a state of being stained with the fluid thereon. The portion in which the component, the substrate and the terminal are in contact with one another may thus have poor contact due to the fluid.

In addition, when filled up with the fluid having high thermal conductivity, the charger may easily dissipate the heat, but may have increased weight.

In addition, when the case of the charger has a single internal space, the fluid may fill even a region which does not relatively need to be filled with the fluid having thermal conductivity, such as a region where neither the component nor the substrate is disposed in the charger, thereby making the charger difficult to have the lighter weight.

In addition, in order to satisfy a standard of no failure when dropped from a predetermined height, it is required for the charger to have the lighter weight and to have the internal component and the substrate, protected from falling impact. However, the charger may be required to further have a support member fixing and protecting the component and the substrate, and may thus be difficult to have the reduced size and weight.

In addition, as the charger has the smaller size, it is difficult to secure a separation distance between the components for securing electrical insulation between the components disposed in the charger.

SUMMARY

An exemplary embodiment of the present disclosure is directed to providing an electric appliance having a smaller size and a reduced overall weight by preventing a fluid from flowing into a space unrelated to a heating component in a state where the fluid fills its case, and a method of manufacturing the same.

In one general aspect, an electric appliance includes: a case including a first space and a second space communicated to each other; a first component disposed in the first space; a second component disposed in the second space; a connection portion electrically connecting the first component and the second component to each other, and extending from the second space to the first space; a potting pattern including a resin material and formed in the first space; a partition wall disposed between the first space and the second space in the case to separate the first space and the second space from each other; and a step portion formed on a boundary line between the first space and the second space by a difference in a width of the case in the first space between a width of the case in the second space, wherein the partition wall is disposed on the step portion, either a guide portion or a partition-wall guide portion is formed on at least one of the step portion and the partition wall, the guide portion being formed by making one surface of the step portion to be recessed and the partition-wall guide portion being formed by making a predetermined region of the partition-wall to be recessed inward, and the connection portion is disposed between the step portion and the partition wall, by being disposed in at least one of the guide portion and the partition-wall guide portion.

A filling pattern having a lower specific gravity than the potting pattern may be disposed in the second space.

The filling pattern may include a plurality of air bubbles.

The potting pattern may have a viscosity of 50 gf/10 mm or more and 1000 gf/10 mm or less.

The case may include an observation window formed at a predetermined position in the first space for checking a filling amount of the potting pattern.

The case may include a fluid level indicator formed in the first space, the fluid level indicator having a scale shape and indicating an appropriate fluid level of the potting pattern.

The first component may have a maximum heating temperature higher than the second component.

The partition wall may include an adhesive portion attached to the step portion.

The partition wall may have a smaller thickness than the case.

The partition may include a reinforcing portion crossing a central portion of one surface of the partition wall.

A central portion of the partition wall may have the convex curved surface.

A central portion of the partition wall may protrude to form a step.

In another general aspect, an adapter includes: a case including a first space and a second space; a heating component disposed in the first space; a partition wall disposed between the first space and the second space in the case to separate the first space and the second space from each other and has a hole, a potting pattern provided in the first space and consist of a resin material; a connection portion extends from the second space to the first space through the hole and electrically connected to the heating component; and a packing member interposed between the hole and the connection portion.

The potting pattern may cover one surface of the partition wall.

The second space may be filled with air.

A filling pattern including a foaming agent may be formed in the second space.

Other features and aspects will be apparent from the following detailed description, the drawings, and the claims.

BRIEF DESCRIPTION OF THE DRAWINGS

FIG. 1 is an exploded perspective view of an electric appliance according to the present disclosure.

FIG. 2 is a cross-sectional view of a portion taken along x-z axes of the electric appliance according to a first exemplary embodiment of the present disclosure.

FIG. 3 is a cross-sectional view of a portion taken along y-z axes of the electric appliance according to a first exemplary embodiment of the present disclosure.

FIGS. 4A to 4D are front views of a partition wall according to the first and second exemplary embodiments and cross-sectional views of a partition wall according to third and fourth exemplary embodiments according to the present disclosure.

FIGS. 5A to 5D are enlarged cross-sectional views of portion A of FIG. 3 according to various exemplary embodiments of the present disclosure.

FIG. 6 is a cross-sectional perspective view of the electric appliance according to an exemplary embodiment of the present disclosure.

FIG. 7 is a cross-sectional view of the electric appliance according to an exemplary embodiment of the present disclosure.

FIG. 8 is another cross-sectional view of the electric appliance according to an exemplary embodiment of the present disclosure.

DETAILED DESCRIPTION OF EMBODIMENTS

Hereinafter, the technical spirit of the present disclosure will be described in more detail with reference to the accompanying drawings. Terms and words used in the present specification and claims are not to be construed as a general or dictionary meaning, but are to be construed as meanings and concepts meeting the technical ideas of the present disclosure based on a principle that the inventors may appropriately define the concepts of terms in order to describe their inventions in best mode.

Therefore, configurations described in exemplary embodiments and the accompanying drawings of the present disclosure do not represent all of the technical spirits of the present disclosure, but are merely most preferable exemplary embodiments. Therefore, the present disclosure should be construed as including all the changes and substitutions included in the spirit and scope of the present disclosure at the time of filing this application.

Hereinafter, the technical spirit of the present disclosure will be described in more detail with reference to the accompanying drawings. The accompanying drawings are only examples illustrated in order to describe the technical idea of the present disclosure in more detail. Therefore, the technical idea of the present disclosure is not limited to forms of the accompanying drawings.

Then, as shown in the drawings, the description defines a longitudinal direction of the case as a z-(axis) direction, a direction perpendicular to the z-(axis) direction as an x-(axis) direction, and a direction perpendicular to z-(axis) direction and the x-(axis) direction as a y-(axis) direction; and also defines the z-(axis) direction as the longitudinal direction of a substrate, the x-(axis) direction as a width direction thereof, and the y-(axis) direction as a thickness direction thereof. In addition, the description describes a positive direction in the z-(axis) direction as an upper side in the longitudinal direction, and a negative direction in the z-(axis) direction as a lower side in the longitudinal direction.

Referring to FIGS. 1 to 3, an electric appliance according to the present disclosure includes: a case 100 including a first space 101 and a second space 102 communicated to each other; a partition wall 200 which is a sheet separating the first space 101 and the second space 102 from each other; a first component 110 disposed in the first space 101; a second component 120 disposed in the second space 102; a connection portion 300 electrically connecting the first component 110 and the second component 120 to each other; and a potting pattern 400 filling the first space 101 and having a viscosity greater than water.

The partition wall 200 may be a removable sheet disposed between the first space 101 and the second space 102 to prevent the potting pattern 400 from flowing into the second space 102 when the potting pattern 400 is formed in the first space 101 in a state where the first space 101 is disposed above the second space 102.

The case 100 may include the first space 101 in which the first component 110 is disposed and the second space 102 in which the second component 120 is disposed. The partition wall 200 may be coupled to and detached from the case 100, and may allow the first space 101 and the second space 102 to be separated from each other, thereby preventing the potting pattern 400 formed in the first space 101 from flowing into the second space 102.

Although not shown, the case 100 may include an inner case and an outer case, and a heat shielding means may be disposed between the inner case and the outer case to lower a surface temperature of the outer case to prevent a low-temperature burn of a user.

The first component 110 may include a substrate (i.e. printed circuit board, PCB) on which a heating element such as a switch or a transformer is mounted, and the second component 120 may include a plug and a bus bar connected to the plug. The connection portion 300 may electrically connect the first component 110 and the second component 120 to each other. The connection portion 300 may connect the first component 110 and the second component 120 to each other by penetrating through the partition wall 200. Alternatively, the connection portion 300 may connect the first component 110 and the second component 120 to each other without penetrating through the partition wall 200. Here, the connection portion 300 may be, for example, a connector or a bus bar.

The potting pattern 400 may be formed in the first space 101, and may disperse and radiate heat generated in the first component 110. It may be preferable that at least a portion of the first component 110 is immerged in the potting pattern 400 and then assembled to the case 100.

The potting pattern may include a resin having thermal conductivity, and the thermal conductivity may be about 1.5 W/mK or more, about 2 W/mK or more, 2.5 W/mK or more, 3 W/mK or more, 3.5 W/mK or more or 4 W/mK or more.

In addition, the potting pattern may include a resin including a filler component having excellent thermal conductivity (1 W/mK or more). Here, the filler may include ceramic, alumina, aluminium nitride (AlN), boron nitride (BN), silicon nitride, zinc oxide (ZnO), silicon carbide (SiC) or beryllium oxide (BeO).

The potting pattern may include an acrylic resin, an epoxy-based resin, a urethane-based resin, an olefin-based resin, an ethylene-vinyl acetate copolymer (EVA)-based resin, or a silicone-based resin. The potting pattern may also include a thixotropic agent, a diluent, a dispersant, a surface treatment agent, a flame retardant or a coupling agent.

The potting pattern may preferably have an elongation of about 10% or more in consideration of impact resistance and vibration resistance.

In addition, the potting pattern may have 400 degrees C. or more of a 5% weight loss temperature in thermogravimetric analysis (TGA), or a residual amount of 70 wt % or more at 800 degrees C., to have ensured stability at a high temperature.

The potting pattern may preferably have adhesiveness of 100 gf/10 mm or more in order not to be separated from the substrate and/or the component mounted on the substrate.

Based on the above configuration, an electric appliance according to the present disclosure may radiate and dissipate the heat generated in the first component 110 mounted in the first space 101 by filling the first space 101 with the potting pattern 400. When a portion of the first space 101, where the potting pattern 400 is not formed, may be defined as a third space, the third space may be filled with air.

In addition, a space filled with the potting pattern 400 may be restricted to the first space 101 due to such a configuration of the partition wall 200, and the second space 102 may be maintained empty, thereby reducing an overall weight of the electric appliance. Therefore, the electric appliance may have a center of gravity maintained as the first space 101 to prevent the component such as a plug connected to the second space 102 from being bent or damaged even when dropped.

Here, the first component 110 may have a maximum heating temperature higher than the second component 120. That is, when the first component 110 and the second component 120 are electrically connected to each other and then operated by the connection portion 300, the first component 110 may have the higher maximum heating temperature than the second component 120, and may have a larger heating area than the second component 120. Here, it is preferable that the second component 120 is heated to a relatively low temperature compared to the first component 110, and has no need to radiate the heat therefrom. Accordingly, the potting pattern 400 may fill only the first space 101 to radiate and dissipate the heat generated in the first component 110.

In addition, the potting pattern 400 may be cured to form a potting layer. That is, the potting pattern 400 may be in a liquid or viscosity state before filling the first space 101, and may be cured when filling the first space 101 to form the potting layer having predetermined strength and elasticity. Here, the potting pattern 400 before being cured may have a viscosity of 50 gf/10 mm or more and 1000 gf/10 mm or less.

Referring to FIG. 3, the second space 102 may have a smaller cross-sectional area than the first space 101, thereby forming a step portion 130 on a boundary line between the second space 102 and the first space 101, and the partition wall 200 may be seated on the step portion 130 in a direction of the first space 101. That is, when comparing cross-sectional areas of the first space 101 and the second space 102, taken in a direction (i.e. x-(axis) direction or y-(axis) direction) perpendicular to an extension direction (i.e. z-(axis) direction) of the case 100, the cross-sectional area of the first space 101 may be larger than that of the second space 102. The step portion 130 may be formed on the boundary line between the first space 101 and the second space 102 by a difference in the cross-sectional area of the first space 101 between that of the second space 102. The first component 110 installed in the first space 101 may have a larger size than the second component 120 installed in the second space 102. To this end, the cross-sectional area of the first space 101 and that of the second space 102 may be formed to have different sizes from each other, thereby making it possible for the electric appliance of the present disclosure to reduce the overall size and weight of the case 100.

Here, it may be preferable that the partition wall 200 is installed on the step portion 130, a maximum cross-sectional area of the second space 102 is smaller than a minimum cross-sectional area of the first space 101, and the cross-sectional area of the partition wall 200 is smaller than the minimum cross-sectional area of the first space 101, and larger than the maximum cross-sectional area of the second space 102.

In addition, a thickness of the partition wall 200 may be smaller than a minimum thickness of the case 100. The case 100 is required to protect the first component 110 and the second component 120, respectively disposed in the first space 101 and the second space 102, and to have predetermined strength and impact resistance to withstand a gripping pressure of the user. On the contrary, the partition wall 200 only needs to withstand a weight of the potting pattern 400 or to be maintained until the potting pattern 400 is cured. It may thus be preferable that the thickness of the partition wall 200 is smaller than the minimum thickness of the case 100 to reduce the weight and size of the electric appliance.

Here, the partition wall 200 may have a lower specific gravity than the case 100. That is, the thickness of the partition wall 200 is smaller than the minimum thickness of the case 100, and a specific gravity of the partition wall 200 may be lower than that of the case 100.

In addition, flexibility of the partition wall 200 may be greater than that of the case 100. That is, the thickness of the partition wall 200 may be smaller than the minimum thickness of the case 100, and simultaneously its flexibility may be greater than that of the case 100. It is thus possible to prevent the partition wall 200 from being cracked or damaged even if the partition wall 200 is bent in a direction of the second space 102 due to the weight of the potting pattern 400.

Referring to FIG. 4A, when the partition wall 200 has the greater flexibility than the case 100, the partition wall 200 may further include a reinforcing portion 210 crossing its central portion. That is, when the partition wall 200 has the smaller thickness than the case 100 and has the predetermined flexibility, the partition wall 200 may be bent in the direction of the second space 102 due to the weight of the potting pattern 400. Here, in order to prevent the partition wall 200 from being bent to be separated from the step portion 130, the reinforcing portion 210 having an 'X' shape may be formed on a surface of the partition wall 200, in contact with the step portion 130.

Referring to FIG. 4B, when the partition wall 200 has the greater flexibility than the case 100, the partition wall 200 may include an adhesive portion 220 attached to the step portion 130. That is, when the partition wall 200 has the smaller thickness than the case 100 and has the predetermined flexibility, the partition wall 200 may be bent in the direction of the second space 102 due to the weight of the potting pattern 400. Here, in order to prevent the partition wall 200 from being bent to be separated from the step portion 130, the adhesive portion 220 may be formed on an edge of the surface of the partition wall 200, in contact with the step portion 130, thereby maintaining a coupling between the partition wall 200 and the step portion 130.

Referring to FIG. 4C, when the partition wall 200 has the greater flexibility than the case 100, the partition wall 200 may have the central portion convex in a direction of the first space 101. That is, when the partition wall 200 has the smaller thickness than the case 100 and has the predetermined flexibility, the partition wall 200 may be bent in the direction of the second space 102 due to the weight of the potting pattern 400. Here, the central portion of the partition wall 200 has the convex shape in the direction of the first space 101, thereby allowing the partition wall 200 to be bent to a minimum in the direction the second space 102.

Referring to FIG. 4D, the central portion of the partition wall 200 may protrude toward the upper side in the longitudinal direction (i.e. positive direction in the z-(axis) direction) of the case 100 to form a step.

In addition, the partition wall 200 may be made of polycarbonate having a thickness of 0.05 mm or more and 3.0 mm or less.

In addition, the partition wall 200 may have 80 degrees C. or more as a thermal deformation temperature.

FIG. 5A shows an exemplary embodiment of the present disclosure, in which a left view shows a guide portion 140, and a right view shows a structure in which the guide portion 140 and the connection portion 300 are connected to each other. Referring to FIG. 5A, the step portion 130 may include the guide portion 140 which is formed in a predetermined region in contact with the partition wall 200 and through which the connection portion 300 passes. The guide portion 140 may be formed by making the predetermined region between the partition wall 200 seated on the step portion 130 and the step portion 130 to be recessed. Here, the connection portion 300 connected to the first component 110 through the guide portion 140 may enter the second space 102 without penetrating through the partition wall 200 to be electrically connected to the second component 120. Here, when a gap is formed between the connection portion 300 and the guide portion 140, a packing member such as a gasket may be disposed in the gap to prevent the potting pattern 400 from flowing into the second space 102 through the guide portion 140.

In addition, as shown in FIG. 5A, an air bubble 400a may be formed in the potting pattern 400.

FIG. 5B shows another exemplary embodiment of the present disclosure, in which a left view shows a hole 230, and a right view shows a structure in which the hole 230 and the connection portion 300 are connected to each other. Referring to FIG. 5B, the partition wall 200 may include the hole 230 through which the connection portion 300 passes. The hole 230 may be formed at a position corresponding to a point where the connection portion 300 and the first component 110 are connected to each other, and the connection portion 300 may be connected to the first component 110 and connected to the second component 120 by penetrating through the partition wall 200. Here, when a gap is formed between the hole 230 and the connection portion 300 penetrating through the hole 230, the packing member such as the gasket may be disposed in the gap to prevent the potting pattern 400 from flowing into the second space 102 through the guide portion 140. More specifically, the packing member may be interposed between the hole and the connection portion 300 to seal the gap formed between the hole and the connection portion 300, and the packing member may be made of a material such as rubber, synthetic resin, absestos, or the like. Here, when there is another structure on a path where the first component 110 and the second component 120 are connected to each other by the connection portion 300, a through hole or an avoidance structure may be installed for the connection portion to pass through or avoid the corresponding structure.

FIG. 5C shows yet another exemplary embodiment of the present disclosure, in which a left view shows a partition-wall guide portion 240, and a right view shows a structure in which the partition-wall guide portion 240 and the connection portion 300 are connected to each other. Referring to FIG. 5C, the partition wall 200 may include a partition-wall guide portion 240 formed in a portion of the partition wall 200, and through which the connection portion 300 passes. The partition-wall guide portion 240 may be formed by making a predetermined region of the partition wall 200 to be recessed inward. Here, the connection portion 300 connected to the first component 110 through the partition-wall guide portion 240 may enter the second space 102 without penetrating through the partition wall 200 to be electrically connected to the second component 120. Here, when a gap is formed between the connection portion 300 and the partition-wall guide portion 240, the packing member such as the gasket may be disposed in the gap to prevent the potting pattern 400 from flowing into the second space 102 through the partition-wall guide portion 240.

FIG. 5D shows yet still another exemplary embodiment of the present disclosure, in which a left view shows the guide portion 140 and the partition-wall guide portion 240, and a right view shows a structure in which the guide portion 140, the partition-wall guide portion 240 and the connection portion 300 are connected to one another. In this exemplary embodiment, a guide structure, through which the connection portion 300 connecting the first space and the second space to each other may pass, may be disposed on each of the partition wall 200 and the step portion 130. According to this exemplary embodiment, the guide structure may be simultaneously formed on both the partition wall and the step portion. Therefore, a space through which the connection portion may pass may be secured as much as possible, and the connection portion may thus be formed thick. As a result, it is possible to stably supply power to the electric appliance.

Meanwhile, at least a portion of the partition wall 200 may be made of a transparent or translucent material. After the partition wall 200 is inserted into the case 100, the fluid included in the potting pattern 400 may flow into the second space 102 in a process of providing the potting pattern 400 in the first space 101. When the partition wall 200 is made of the transparent or translucent material, it is possible to check the inflow of the potting pattern 400 during an assembly process, thereby preventing production of a defective or low-quality product.

Referring to FIG. 6, the case 100 may include an observation window 150 formed at a predetermined position in the first space 101 for checking a filling amount of the potting pattern 400. The observation window 150 may penetrate through the inner and outer surfaces of the predetermined position of the case 100, corresponding to the first space 101. Through the observation window 150, it is possible to visually check the formed height and state of the potting pattern 400 filling the first space 101 from the outside. Here, a transparent or translucent sheet may be mounted on the observation window 150 to prevent the potting pattern 400 from leaking out of the case 100.

In addition, at least a portion of the case 100 may be made of the transparent or translucent material. When at least a portion of the case 100 is made of the transparent or translucent material, it is possible to check, from the outside, how high the formed height of the potting pattern 400 is and whether the potting pattern 400 flows into the second space 102. As a result, it is possible to prevent the production of the defective or low-quality product in a process of manufacturing the electric appliance.

Referring to FIG. 7, the case 100 may include a fluid level indicator 160 formed in the first space 101, the fluid level indicator having a scale shape and indicating an appropriate fluid level of the potting pattern 400. The fluid level indicator 160 may indicate the appropriate amount and maximum amount of the potting pattern 400 to fill the first space 101. It is thus possible to visually check whether the potting pattern 400 fills the first space 101 more than necessary or the potting pattern 400 is formed in an amount lower than necessary. As a result, it is possible to prevent the production of the defective or low-quality product during the manufacturing process.

Referring to FIG. 8, an electric appliance according to the present disclosure may include a filling pattern 500 having a lower specific gravity than the potting pattern 400 in the second space 102, or made of air. Here, the filling pattern 500 may include air or a foaming agent. When the crack occurs in the partition wall 200, or the partition wall 200 is deviated from its regular position, the potting pattern 400 filling the first space 101 may enter the second space 102. Here, the filling pattern 500 may fill the second space 102, thereby preventing the potting pattern 400 from entering the second space 102.

Here, the filling pattern 500 may have the lower specific gravity than the potting pattern 400. That is, in order to prevent the second space 102 from having an excessively increased weight by being filled with filling pattern 500, it is preferable that the filling pattern 500 is made of a fluid having the specific gravity different from that of the potting pattern 400, and has an amount less than the potting pattern 400.

In addition, the filling pattern 500 may be a foaming agent that is spread in a form of a bubble after filling an object, and the filling pattern 500 may thus be spread after filling the second space 102. Here, the filling pattern 500 may be made of a material having a plurality of porosity. That is, the filling pattern 500 may include the plurality of air bubbles 400a.

Referring to FIGS. 2 and 3, an adapter according to the present disclosure includes: a case 100 including a first space 101 and a second space 102; a heating component disposed in the first space 101; a connection portion 300 disposed in the second space 102 and electrically connected to the heating component; and a partition wall 200 disposed between the first space 101 and the second space 102 in the case 100 to separate the first space 101 and the second space 102 from each other.

In addition, the adapter may further include a potting pattern including a resin material and formed in the first space 101, in which the potting pattern 400 covers one surface of the partition wall 200.

A method of manufacturing an electric appliance according to the present disclosure includes: (a) preparing a case 100 including a first space 101 and a second space 102 to which a second component 120 is connected, (b) disposing a connection portion 300 electrically connected to the second component 120 in the case 100, (c) disposing a partition wall 200, which is a sheet separating the first space 101 and the second space 102 from each other, in the case 100, (d) filling the first space 101 with a potting pattern 400 having a viscosity greater than water, and (e) inserting the first component 110 into the first space 101 to be electrically connected to the connection portion 300.

For reference, when the first component 110 is disposed in the case 100 before the potting pattern 400 is injected into the case, it is difficult to insert a nozzle for injecting the potting pattern 400 due to a narrower space between the first component 110 and the case 100. In addition, it may be difficult to evenly inject the potting pattern 400 in the first space 101, and an air pocket may easily occur, thus reducing heat radiation performance. The present disclosure may solve the above problem by first injecting the potting pattern 400 into the case 100 in which the first component 110 is not inserted.

Here, in the method of manufacturing an electric appliance according to the present disclosure, the operation (b) may further include (b-1) filling the second space 102 with a filling pattern 500 after electrically connecting the connection portion 300 to the second component 120.

As set forth above, the exemplary embodiments of the present disclosure may have the following effects:

(1) The partition wall may separate the first space that is filled with the fluid and the second space that does not need to be filled with the fluid from each other, thereby preventing more fluid than necessary from filling the case or from flowing into the second space. The case of the electric appliance may thus have the smaller size and the reduced overall weight.

(2) In addition, compared to a case where the case itself has a partition-wall shape, it may be easier to dispose a connection portion (i.e. bus bar) that electrically connects the components respectively disposed in the first space and the second space to each other through the partition wall. It is thus possible to assemble the components to each other more easily, and to prevent the leakage of the potting pattern more effectively.

(3) The case may have the overall center of gravity maintained as the first space to prevent the second space in which the plug is formed from hitting the ground when dropped. In this manner, it is possible to prevent the plug from being bent or damaged.

(4) The reinforcing portion may be formed on the partition wall, or the central portion of the partition wall has a convex shape toward the first space. It is thus possible to prevent the partition wall from being separated, cracked or damaged by the weight of the potting pattern.

(5) The adhesive portion may be formed on the edge of the partition wall and attached to an inner surface of the case to prevent the partition wall from being separated from at a predetermined position.

The present disclosure is not limited to the abovementioned exemplary embodiments, but may be variously applied, and may be variously modified without departing from the gist of the present disclosure claimed in the claims.

What is claimed is:

1. An electric appliance comprising:
    a case including a first space and a second space communicated to each other;
    a first component disposed in the first space;
    a second component disposed in the second space;
    a connection portion electrically connecting the first component and the second component to each other, and extending from the second space to the first space;
    a potting pattern including a resin material and formed in at least a portion of the first space; and
    a partition wall disposed in the case, separating the first space from the second space and keeping the potting pattern in at least a portion of the first space.

2. The electric appliance of claim 1, wherein a filling pattern having a lower specific gravity than the potting pattern is disposed in the second space.

3. The electric appliance of claim 2, wherein the filling pattern includes a plurality of air bubbles.

4. The electric appliance of claim 1, wherein the potting pattern has a viscosity of 50 gf/10 mm or more and 1000 gf/10 mm or less.

5. The electric appliance of claim 1, wherein the case includes an observation window formed at a predetermined position in the first space for checking a filling amount of the potting pattern.

6. The electric appliance of claim 1, wherein the case includes a fluid level indicator formed in the first space, the fluid level indicator having a scale shape and indicating an appropriate fluid level of the potting pattern.

7. The electric appliance of claim 1, wherein the first component has a maximum heating temperature higher than the second component.

8. The electric appliance of claim 1, wherein the partition wall includes an adhesive portion attached to a step portion formed on a boundary line between the first space and the second space by a difference in a width of the case in the first space between a width of the case in the second space.

9. The electric appliance of claim 1, wherein the partition wall has a smaller thickness than the case.

10. The electric appliance of claim 1, wherein the partition includes a reinforcing portion crossing a central portion of one surface of the partition wall.

11. The electric appliance of claim 1, wherein a central portion of the partition wall has the convex curved surface.

12. The electric appliance of claim 1, wherein a central portion of the partition wall protrudes to form a step.

13. An adapter comprising:
    a case including a first space and a second space;
    a heating component disposed in the first space;
    a potting pattern provided in at least a portion of the first space;
    a partition wall disposed in the case, separating the first space from the second space and keeping the potting pattern in at least a portion of the first space;
    a connection portion extends from the second space to the first space and electrically connected to the heating component; and
    a packing member.

14. The adapter of claim 13, wherein the potting pattern covers one surface of the partition wall.

15. The adapter of claim 13, wherein the second space is filled with air.

16. The adapter of claim 13, wherein a filling pattern including a foaming agent is formed in the second space.

* * * * *